Feb. 3, 1970 L. D. SEADER ET AL 3,493,882
UNIT TRANSISTOR AMPLIFIER WITH MATCHED
INPUT AND OUTPUT IMPEDANCES
Filed Feb. 17, 1967 2 Sheets-Sheet 1

INVENTORS
LEONARD D. SEADER
JAMES E. STERRETT
BY Fleht, Hohbach, Test, Albritton & Herbert
ATTORNEYS Feb. 3, 1970 L. D. SEADER ET AL 3,493,882

UNIT TRANSISTOR AMPLIFIER WITH MATCHED INPUT AND OUTPUT IMPEDANCES

Filed Feb. 17, 1967 2 Sheets-Sheet 2

INVENTORS
LEONARD D. SEADER
JAMES E. STERRETT

BY Fleher, Hohbach, Test, Albritton & Herbert

ATTORNEYS

United States Patent Office 3,493,882

Patented Feb. 3, 1970

3,493,882

UNIT TRANSISTOR AMPLIFIER WITH MATCHED INPUT AND OUTPUT IMPEDANCES

Leonard D. Seader, Saratoga, and James E. Sterrett, Palo Alto, Calif., assignors to Avantek, Inc., Santa Clara, Calif., a corporation of California Filed Feb. 17, 1967, Ser. No. 616,918
Int. Cl. H03f *1/08*
U.S. Cl. 330—28 5 Claims

ABSTRACT OF THE DISCLOSURE

An amplifier having a combination of local series and shunt feedback to provide matched input and output impedances permitting cascading of a number of amplifiers or amplifiers and other devices without signal degradation.

This invention releates to unit amplifiers which can be cascaded without suffering signal deterioration.

The use of local feedback loops in transistor amplifiers to reduce distortion, provide flat frequency response and stabilize operation is well known. The local feedback loops may comprise passive resistance means in series with the emitter terminal of a transistor connected as a common emitter amplifier (series feedback) or passive resistance means connected between the collector and base terminals of a transistor connected in an amplifier circuit (shunt feedback). Some amplifiers have employed a combination of series and shunt local feedback.

When several transistor amplifiers are cascaded and operated at very high frequencies, there is a loss in gain flatness and an increase in distortion due to impedance interaction between stages.

It is a general object of the present invention to provide a unit amplifier having combined series shunt local feedback to provide predetermined matched input-output impedance and gain.

It is another object of the present invention to provide a unit amplifier which may be cascaded with other unit amplifiers or devices such as filters, hybrids, mixers, limiters or the like without suffering degradation or attenuation of signal due to reflections caused by impedance mismatch.

The foregoing and other objects will become more clearly apparent from the following description taken in connection with the accompanying drawings.

Referring to the drawings.

Figure 1:
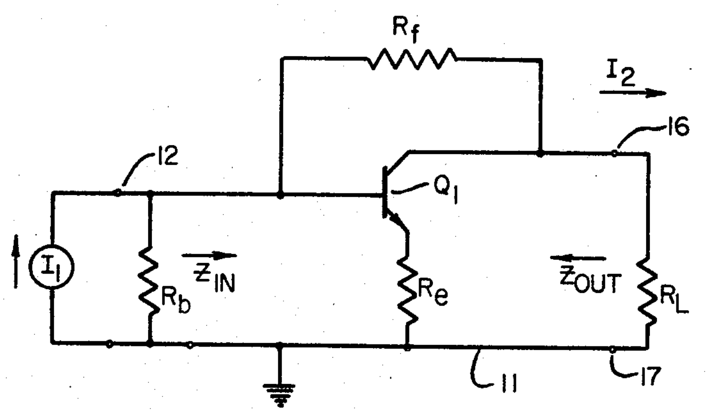
FIGURE 1 is a basic circuit diagram of a common emitter unit amplifier.

The basic A-C equivalent circuit of the unit amplifier is shown in FIGURE 1. It includes transistor $Q_1$ connected in a common emitter configuration, the line 11 indicating the common terminal. Input signals are applied to the base of the base of the transistor between the input terminal 12 and the common line 11. Resistor $R_b$ represents the signal source impedance. The emitter terminal is connected to the common line 11 through emitter resistor $R_e$ which forms the local series feedback path. The collector of the transistor is connected to output terminal 16. A load resistor $R_L$ is connected between terminal 16 and the common line 11. A local shunt feedback resistor $R_f$ is connected between the collector and base terminals of the transistor $Q_1$.

The input impedance is represented by the arrow labelled $Z_{in}$, while the output impedance is represented by the arrow labelled $Z_{out}$.

The input and output impedances of the amplifier are given by the following expression:

$$Z_{in}=R_f\left[\frac{1/R_f+1/R_L}{1/R_e+1/R_L}\right] \quad (1)$$

$$Z_{out}=R_e\left[\frac{R_f+R_b}{R_e+R_b}\right] \quad (2)$$

The current gain if the amplifier is given by $$I_2/I_1=\frac{1-R_f/R_e}{1+R_f/R_b+R_L[1/R_b+1/R_e]} \quad (3)$$

We have discovered that when the input and output impedances are equal $$Z_{in}=Z_{out}=R_o \text{ and } R_L=R_b=R_o \quad (4)$$

the product:

$$R_fR_e=R_o^2 \quad (5)$$

and $$I_2/I_1=\frac{1-\sqrt{R_f/R_e}}{2} \quad (6)$$

Therefore, the product $R_fR_e$ determines the characteristic input and output impedance of the circuit while the ratio $R_f$ to $R_e$ determines the gain of the circuit. Therefore, the gain and characteristic impedance of the amplifier may be any specified arbitrary value.

With the output and input impedances matched, a number of amplifiers having the same impedance can be connected in cascade to provide high gain amplifiers without suffering appreciable degradation of signal due to mismatch. This is especially important at RF frequencies where mismatch is typically reactive and results in variations in amplitude response. Thus, the amplifier may be considered a building block or module whose gain with frequency is constant for an arbitrary low frequency to an upper frequency determined solely by the capability of the active device used as the amplifier and at the high frequencies the physical configuration of the circuit. The modules may be manufactured in large quantity at economical prices using printed circuit techniques, hybrid techniques, monolithic fabrication techniques or flip-chip techniques. The amplifiers may also be combined with other modules such as attenuators, filters, hybrids, mixers or limiters having the same characteristic impedance to perform system functions.

Figure 2:
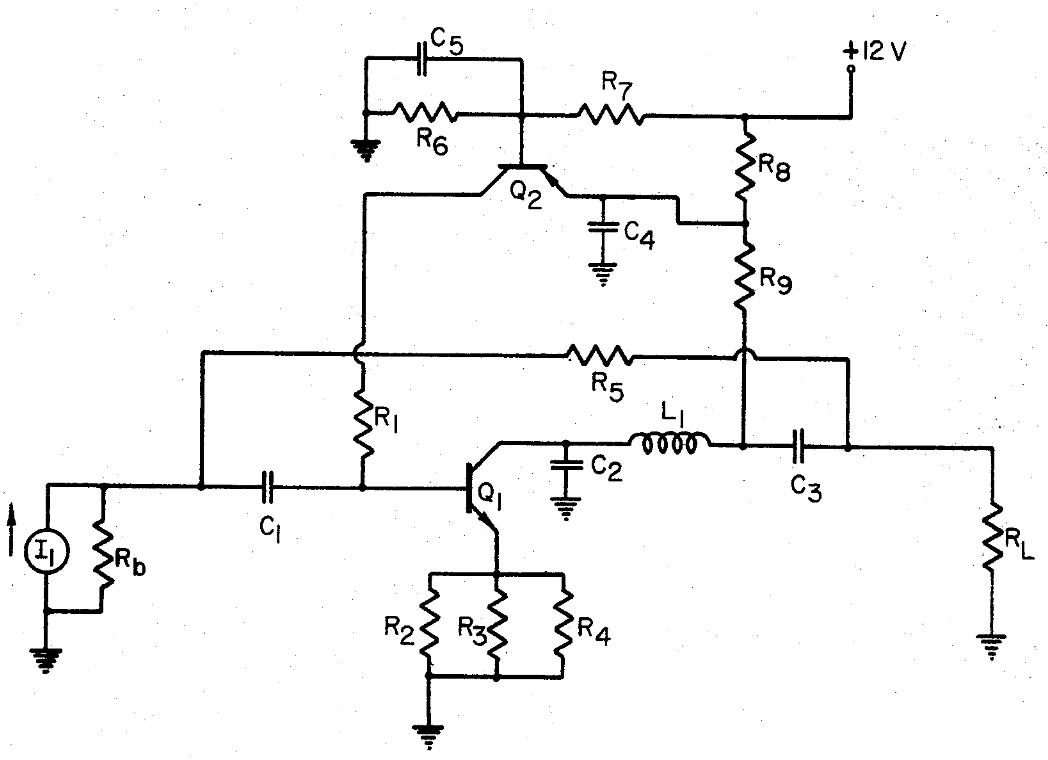
FIGURE 2 is a detailed circuit diagram of a unit amplifier in accordance with the present invention.

FIGURE 2 shows a wide band unit amplifier incorporating the present invention. Like reference numerals have been applied to parts which correspond to those in FIGURE 1. The resistor $R_e$ comprises the parallel resistors $R_2$, $R_3$ and $R_4$. A blocking capacitor $C_1$ is connected between the input terminal 11 and the base of the transistor. The shunt capacitor $C_2$ and the series inductance $L_1$ provide compensation for the decrease in current gain of the transistor at high frequencies to provide a flat gain versus frequency response over a relatively broad band of frequencies. The capacitor $C_3$ is a blocking capacitor and serves to block DC signals applied between the collector and base of the transistor from the output load $R_L$. In the circuit shown, the transistor $Q_2$ and associated circuit components serve to stabilize the operating point of transistor $Q_1$. This allows the emitter of $Q_1$ to be grounded directly through the emitter resistors which minimizes emitter lead inductance at the higher frequencies. The voltage drop in the resistor $R_8$, due to the collector current in transistor $Q_1$, is compared with the voltage drop in resistor $R_7$, due to current flow in resistor $R_6$, to vary the bias on the base of transistor $Q_2$ and, therefore, the emitter collector current. This, in turn, controls the base current in transistor $Q_1$. The resistor $R_1$ isolates the base of $Q_1$ from the collector capacitance of $Q_2$. The resistor $R_9$ provides a DC path for the collector current of $Q_1$. An amplifier was constructed in accordance with the circuit of FIGURE 2 in which the circuit components and voltages were as follows:

Voltage ............................volts.. +12

Transistors

| | |
|---|---|
| $Q_1$ | A485 |
| $Q_2$ | 2N3905 |

Resistors

| | Ohms |
|---|---|
| $R_b$ | 50 |
| $R_1$ | 2.2K |
| $R_2$ | 16 |
| $R_3$ | 16 |
| $R_4$ | 100 |
| $R_L$ | 50 |
| $R_5$ | 270 |
| $R_6$ | 6.8K |
| $R_7$ | 3.3K |
| $R_8$ | 220 |
| $R_9$ | 220 |

Capacitors

| | | |
|---|---|---|
| $C_1$ | picofarads | 1000 |
| $C_2$ | do | 2 |
| $C_3$ | do | 1000 |
| $C_4$ | microfarad | .01 |
| $C_5$ | picofarads | 470 |

Inductor $L_1$: 3 turn #26 wire wound at .090 D.

Figure 3:
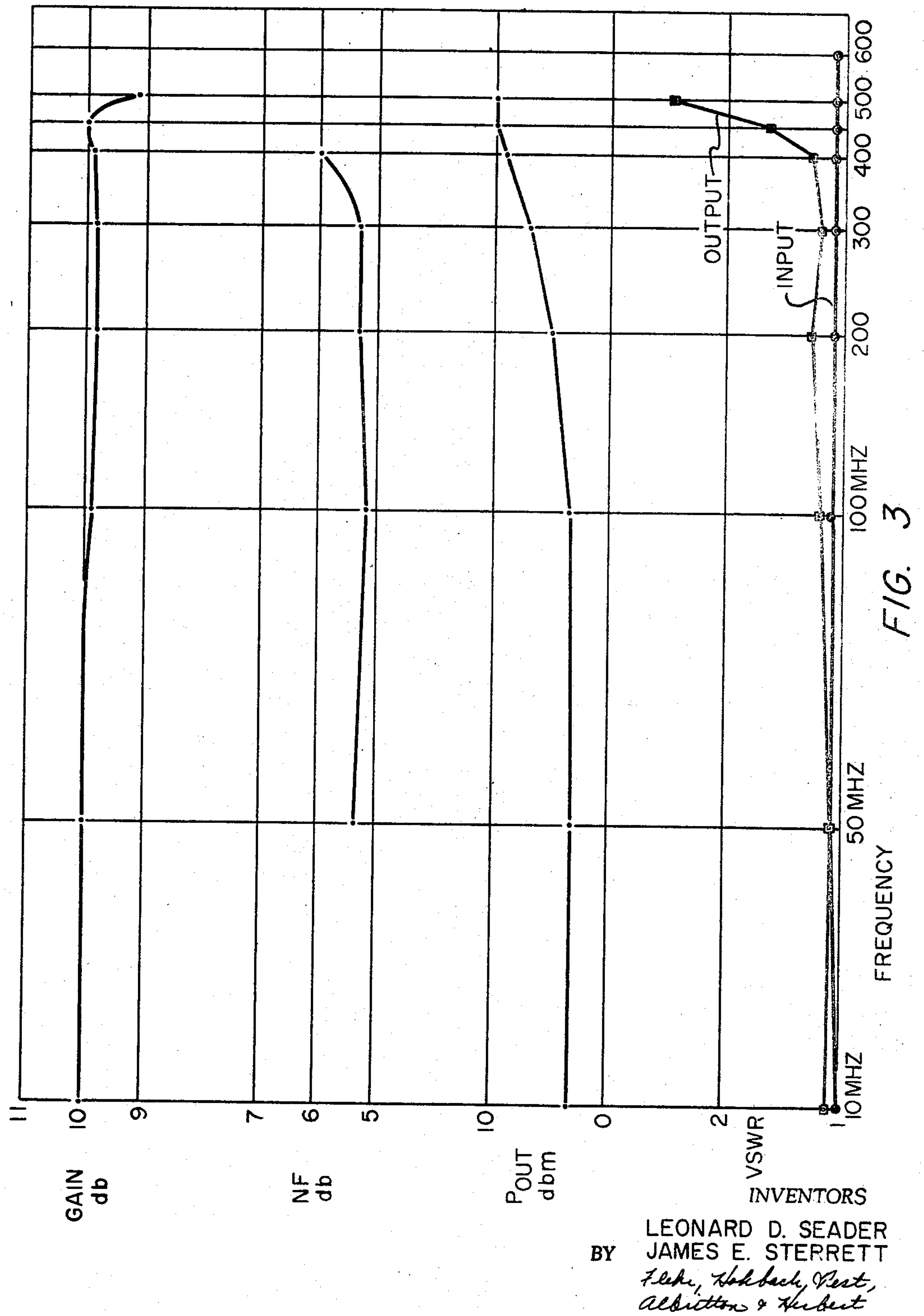
FIGURE 3 shows the gain, voltage standing wave ratio (VSWR), output power capability and noise figure as a function of frequency for an amplifier in accordance with FIGURE 2.

The curve of FIGURE 3 shows the gain, voltage standing wave ratio (VSWR), output power capability ($P_{out}$), and noise frequency (NF) as a function of frequency for the amplifier. The amplifier provides a very flat gain characteristic with only 0.2 db gain variation with 10 db of gain over the frequency range of 10 mHz. to 480 mHz. Also of particular interest is the very low input and output VSWR—less than 1.1 at the input and less than 1.3 at the output up to 400 mHz.

Thus, it is seen that by using the principles of the present invention, by minimizing emitter lead inductance and by providing high frequency compensation consisting of $C_2$ and $L_1$, an amplifier module has been constructed which exhibits a very flat gain characteristic and whose input and output impedance are accurately matched to a desired characteristic impedance.

When the transistor runs at low current, the emitter resistor $R_e$ can consist entirely of the transistor emitter resistance, $R_e=26/I_e$. This would provide advantages in low noise applications since the transistor would be running at low current and no external emitter resistor would be present to generate noise.

Thus, it is seen that there is provided an improved unit amplifier which can be cascaded to form high gain amplifiers or connected with other circuit components in systems applications. The amplifier is simple in construction. Since the amplifier includes passive components having values which are achievable in present day integrated microcircuit technology, it can be so formed. The amplifier may also be incorporated in hybrid circuits combining semiconductor technology and stripline or microwave technology.

We claim:

1. An amplifier including a transistor having base, emitter and collector terminals, means for applying an input signal between the base and emitter terminals, and means for deriving an output signal between the collector and emitter terminals in which there is provided shunt feedback resistance means between the output and input means and resistance means in series with the emitter current path providing series feedback, said shunt feedback resistance means and series feedback resistance means being selected to provide predetermined and equal input and output impedances and a predetermined gain whereby said amplifier has a predetermined characteristic impedance determined solely by the square root of the product of said shunt and series feedback resistance means.

2. An amplifier as in claim 1 including means connected between the base and collector terminals of said transistor for stabilizing the operating point of said transistor.

3. An amplifier as in claim 2 wherein said means comprises a transistor having its emitter and collector terminals connected between the base and collector of said transistor to control the base and collector of said transsistor to control and base current of said transistor.

4. An amplifier as in claim 2 including blocking capacitor means connected in series with the base and collector terminals of said transistor and a compensating circuit including an inductance series connected to said collector terminal and a capacitance shunt connected to said collector terminal.

5. An amplifier as in claim 1 wherein:

$$Z_{in}=R_f\left[\frac{1/R_f+1/R_L}{1/R_e+1/R_L}\right]$$

$$Z_{out}=R_e\left[\frac{R_f+R_b}{R_e+R_b}\right]$$

and $$I_2/I_1=\frac{1-R_f/R_e}{1+R_f/R_b+R_L[1/R_b+1/R_e]}$$

where $R_f$=feedback resistance between collector and base of said transistor
$R_e$=resistance in series with emitter lead of said transistor
$R_b$=signal source impedance
$R_L$=load impedance
$Z_{in}$=input impedance
$Z_{out}$=output impedance
$I_1$=input current
$I_2$=output current
$I_2/I_1$=gain in which $R_f$, $R_e$, $R_b$ and $R_L$ are selected to provide:

$$Z_{in}=Z_{out}=R_o \text{ and } R_L=R_b=R_o$$

whereby $R_fR_e=R^2_o$, the characteristic impedance and $$I_2/I_1=\frac{1-\sqrt{R_f/R_e}}{2}$$

the gain.

References Cited

UNITED STATES PATENTS

| | | | |
|---|---|---|---|
| 2,972,704 | 2/1961 | Stanley et al. | 330—27 X |
| 3,100,877 | 8/1963 | Maupin | 330—28 |
| 3,331,029 | 7/1967 | Banasiewicz et al. | 330—28 X |

OTHER REFERENCES

Lefkowitz "Transistor A-C Amplifier Uses Multiple Feedback," Electronics May 23, 1958, pp. 84, 85.

Reference Data for Radio Engineers, International Telephone and Telegraph Corporation, Fourth Edition, 1956 pp. 252, 253.

ROY LAKE, Primary Examiner

J. B. MULLINS, Assistant Examiner

U.S. Cl. X.R.

330—25, 102